SOLID-STATE ELECTRON DEVICE

Original Filed Oct. 29, 1964 2 Sheets-Sheet 1

3,483,445

SOLID-STATE ELECTRON DEVICE

Franco Forlani, Rho, Milan, and Nicola Minnaja, Milan, Italy, assignors, by mesne assignments, to Olivetti-General Electric S.p.A., Milan, Italy, an Italian company Continuation of application Ser. No. 407,407, Oct. 29, 1964. This application Nov. 14, 1968, Ser. No. 779,299
Claims priority, application Italy, Oct. 30, 1963, 22,489/63
Int. Cl. H01l 3/00, 5/00
U.S. Cl. 317—234 4 Claims

ABSTRACT OF THE DISCLOSURE

A two-terminal solid state electron device, comprising a semi-conductor and a metal layer having an insulating layer interposed therebetween, the insulating layer being of suitable substantially uniform thickness to allow passage of charges between the semi-conductor and metal layer by tunnel effect.

This application is a continuation of S.N. 407,407, filed Oct. 29, 1964, now abandoned.

The present invention relates to a solid-state electron device.

In the known P-N junction semiconductor diodes, wherein the current conduction mechanism substantially involves minority charge carriers, the maximum working frequency is strictly limited by minority-carrier storage effects near the junction. Especially when the diode is used in switching circuits, the diode recovery time from forward conduction to reverse conduction proves to be exceedingly long due to slow recombination and depletion of said stored carriers.

Moreover, the diodes used in the switching circuits must have a low forward resistance and a high reverse resistance. The known P-N junction diodes, for which a slow forward resistance, a high reverse resistance, a low switching time and a high maximum allowed forward current are simultaneously required, involve such an accurate determination of the geometrical dimensions and control of the conductivity distribution inside the semiconductor, to make their manufacturing processes expensive and complicated.

Furthermore, the electrical characteristics of said known diodes exhibit insufficient stability due to variation of the surface conditions, whereby expensive protection means, such as hermetic sealing, must be provided. Another disadvantage of the known diodes is their sensitivity to temperature.

There has been proposed a diode comprising an insulating layer sandwiched between two metal layers. In such a diode some of said disadvantages are eliminated because current conduction involves electrons tunneling from metal into insulator.

However this diode exhibits poor rectifying properties due to substantial symmetry in its current-voltage characteristics.

It is further known that a semiconductor layer contacting a metal layer through a so called "artificial barrier" made of insulating material exhibits rectifying properties. However, these rectifying properties are due to pinholes and other imperfections in the insulating layer, whereby conduction is substantially due to lack of uniformity in the insulating layer. Therefore, the conduction mechanism, based on localized breakdown through physical imperfections, proves to be substantially unstable and uncontrolled, thus giving poor external characteristics.

Moreover, when used as variable-capacity condensers, the known diodes exhibit insufficiently sharp capacity changes upon varying the applied voltage.

It is an object of the present invention to provide a solid-state electron device which allows high operating frequency and low recovery time to be attained.

Another object of the present invention is to provide a solid-state electron device largely insensitive to changes in temperature, humidity and other environmental conditions.

Another object of the present invention is to provide a solid-state electron device having superior rectifying properties.

Still another object of the present invention is to provide a solid-state electron device which can be easily manufactured and, moreover, which can be easily embodied into integrated circuits.

These and other objects are accomplished by the device according to the invention, which comprises an insulator layer interposed between and contacting a semiconductor layer and a conductor layer and is characterized in that said insulator layer is substantially uniform and has such a thickness as to pass current by tunnel effect.

Other objects and features of the invention will become apparent from the following description of a preferred embodiment thereof, with reference to the accompanying drawings, wherein:

FIG. 1 schematically shows the structure of a solid-state electron device according to the invention;

FIGS. *4a*, *4b* and *4c* show a diagram of the energy levels in a device made according to the invention under various bias conditions.

The solid-state electron device made according to an invention comprises (FIG. 1) an insulating layer D interposed between a semiconductive layer S and a conductive layer M. The external layers M and S have separate low resistance contact terminals 1 and 2 attached thereto. In the following description, the terminal bonded to the conductive layer will be designated as the positive terminal and the terminal soldered to the semiconductive layer as the negative terminal.

According to one embodiment of the invention, the semiconductive layer S, the insulating layer D and the conductive layer M are made of silicon, silicon dioxide and aluminum respectively.

Figure 1:
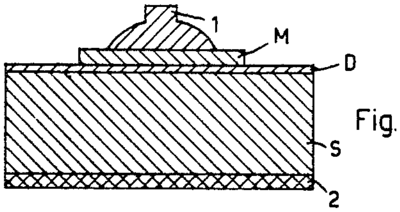

Some specimens of the device according to FIG. 1 have been obtained by the following method.

A single-crystal N-type silicon ingot having a volume resistivity ranging from 1.6 to 2.4 Ω cm. was grown. The ingot was sawed into wafers having planar surfaces parallel to the (111) plane of the crystal. The wafers were lapped with a 1200 mesh Carborundum powder and then etched in a $CP_6$ solution.

After etching, the wafers were mechanically polished with diamond powder and the polishing was repeated with powder of decreasing grain diameter until a surface flatness better than that appearing after etching was attained. According to an alternative method, etching with HCl in gaseous phase was used to attain the required flatness.

Thereafter, silicon dioxide was thermally grown on the silicon surface at a temperature of 900° C.$\mp$2° C. in an open quartz tube by exposure to a pure oxygen flow of 7.77 cm.$^3$/min. cm.$^2$ for about 20 min.

Before being introduced into the furnace the wafers were wetted in a 49% HF solution and, after having been washed in deionized water, they were treated in a 70% $HNO_3$ solution for about 1 minute at room temperature. The last mentioned treatment produces a very thin passivated film on the silicon surface.

After thermal oxidation, a photosensitive film was smeared onto one face of the oxidized wafer. Then, after suitable thermal treatment, the steps of exposing said face to ultraviolet light through a glass mask leaving unexposed a plurality of separated circular areas having a 310 $\mu$m. diameter, developing the exposed photosensitive film and removing the film from the undeveloped areas were performed.

Thereafter the treated surface of the wafers was cleaned in a glow discharge and then aluminum was evaporated onto said treated surface in a vacuum chamber at an approximately $5\cdot10^{-6}$ Torr pressure. By wetting in acetone, the photosensitive film covered with aluminum was removed, thus finally leaving separate aluminum disks on the oxidized surface.

Then the wafers were cut into square portions, each one containing one of said aluminum disks. Each portion was mounted in a case, with the uncovered silicon side facing the conductive base header of the case and soldered thereto by means of a gold-antimony alloy. Contact to the aluminum disk was obtained by bonding thereto a gold wire by thermocompression. Then the cases were filled with nitrogen and sealed.

Thereafter the specimens were subjected to an aging process at 300° C. for 60° hours.

It is apparent to those skilled in the art that many other methods may be used to obtain the device according to the present invention.

The specimens thus obtained have been tested to investigate their external electrical characteristics.

Figure 2:
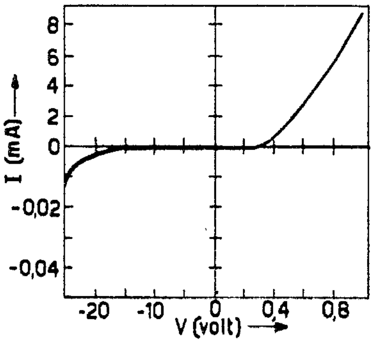
FIGS. 2 and 5 to 11 show the current-voltage characteristics of the device according to the invention.

FIG. 2 shows the current vs. voltage characteristics for a typical specimen.

The applied voltage V is said to be positive when the positive terminal bonded to the metal layer M has a potential higher than the potential of the other negative terminal of the device, atnd the current I flowing through the device is said to be positive when directed from the positive terminal to the negative terminal.

The forward I–V characteristics, that is the region where positive voltages are applied, exhibits a first portion wherein current I is practically zero, and a second portion wherein current I rapidly increases under increasing applied voltages V.

The reverse I–V characteristics, that is the region where negative voltages are applied, exhibits a first portion wherein current I is practically zero, and a second portion wherein current I rapidly increases under applied voltages V increasing in absolute magnitude.

Figure 6:
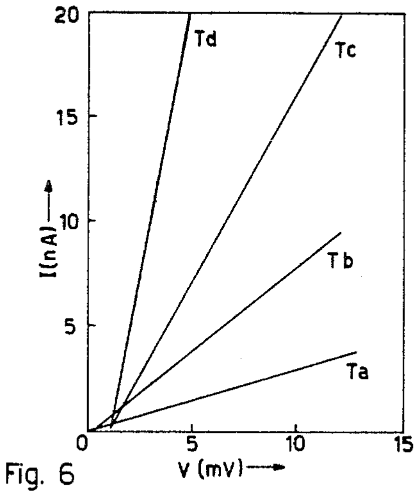

More particularly, the forward I–V characteristics exhibits a first region (FIG. 6) wherein the current I increases linearly according to the ohmic conduction law. In FIG. 6 four different curves T*a*, T*b* T*c* and T*d* are plotted to show the behaviour of the device at different temperatures T*a*=17° C. T*b*=41.4° C., T*c*=64.1° C. and T*d*=93.4° C.

Figure 7:
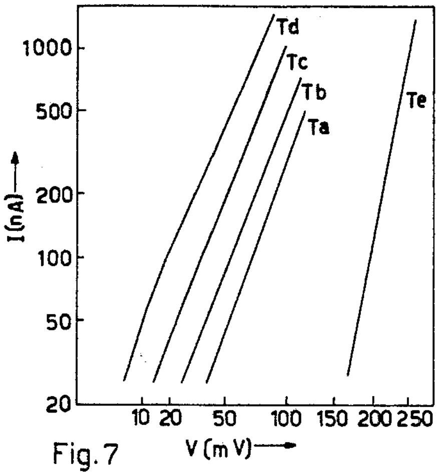

As applied voltage V increases, a second region (FIG. 7) is found in the forward I–V characteristics, wherein the current I increases according to the approximate law $I=Io\cdot\exp AV^{1/2}$, I*o* and A being temperature dependent parameters. In FIG. 7 the four curves T*a*, T*b*, T*c* T*d* show the behavior of the device at the four corresponding temperatures specified above, whereas the curve T*e* refers to the liquid nitrogen temperature.

Figure 8:
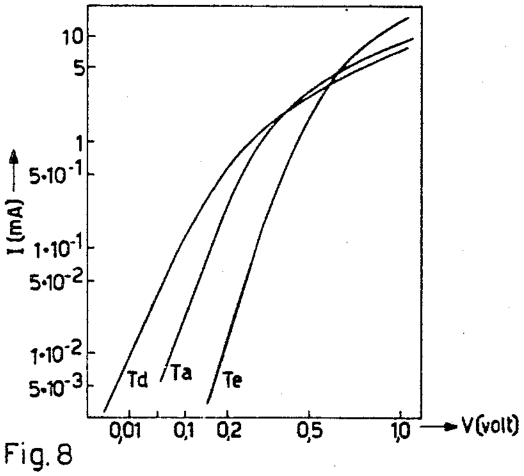

As the applied voltage V further increases, a third region is found in the forward I–V characteristics, wherein the current I increases as shown in FIG. 8. Here again the three curves T*a*, T*d*, and T*e* refer to the three corresponding temperatures specified above.

Figure 5:
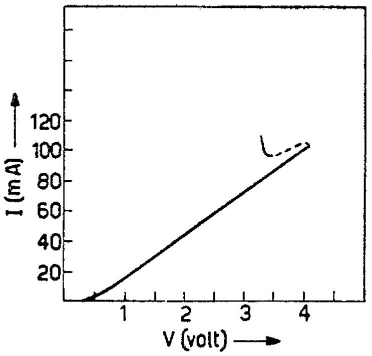

At higher forward voltage a fourth voltage a fourth conduction region exhibiting negative resistance is found. In a typical specimen, negative resistance was found at about 4 V. and 100 ma. (FIG. 5).

Figure 9:
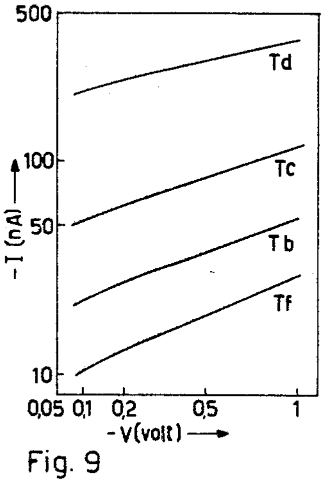

The reverse I–V characteristics exhibits a first region (FIG. 9), wherein the reverse current increases according to the approximate law $I=Io'\cdot\exp A'V^{1/2}$, I*o*′ and A′ being temperature dependent parameters. In FIG. 9 the three curves T*b*, T*c*, T*d* show the behaviour of the device at the corresponding temperatures specified above, whereas curve T*f* refers to the temperature $Tf=19.1°$ C.

Figure 10:
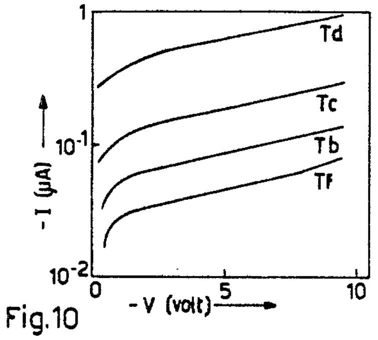

As the absolute value of the reverse applied voltage V increases, a second region is found (FIG. 10), wherein the reverse current I increases according to the approximate law $$I=Io''\cdot\exp\frac{V}{Vo}$$

Figure 11:
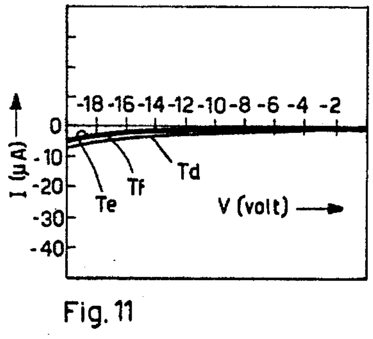

V*o* being equal to about 0.1 volt and being practically independent from the temperature. FIG. 11 shows a portion of the reverse I–V characteristics at the three temperatures T*d*, T*e*, T*f* on a linear scale.

It is apparent that increasing reverse currents are obtained upon increasing temperature.

The occurrence of breakdown was observed at a reverse applied voltage varying in the range from 15 V. to 20 V. or more for some different specimens under test. It has been found that the forward and reverse conduction characteristics are completely reproducible after said breakdown. Therefore it is apparent that the strong reverse current flowing through the device during breakdown does not destroy the device nor does it irreversibly modify the conduction properties considered above.

The external electrical characteristics of the device made according to the invention may be explained on the following basis.

Figure 4A:
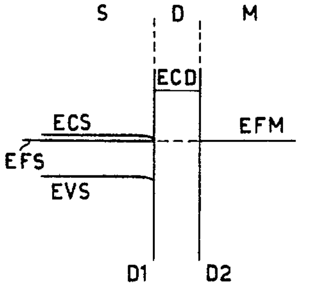

FIG. 4*a* shows schematically the electron energy levels in the device according to FIG. 1 when the applied voltage V is equal to zero.

Lines D1 and D2 represent the surfaces of the intermediate insulating layer D where contact is made to the semiconductive-layer S and to the conductive metal layer M respectively; lines ECS and EVS represent the lower limit of the conduction band and the higher limit of the valence band, respectively, for the semiconductive material of the layer S, said bands being separated by a forbidden energy gap; line ECD represents the lower limit of the conduction band for the dielectric material of the insulating layer D; line EFM represents the Fermi level for the metal M and line EFS represents the Fermi level for the semiconductive material S, said two Fermi levels being coincident under the aforesaid zero-bias condition.

In the surface region of the semiconductor S near the semiconductor-insulator interface, lines EVS and ECS representing the upper limit of the valence band and the lower limit of the conduction band, respectively, bend downward due to accumulation of electrons in said surface region.

Figure 4B:
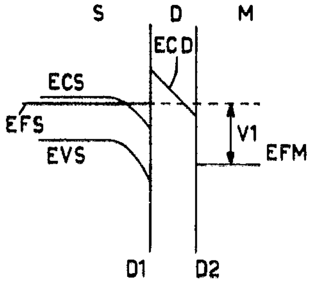

Upon positively biasing the metal layer M with respect to the semiconductive layer S by externally applying a positive voltage V1 between the positive terminal and the negative terminal of the device, the energy level diagram is modified as sketched in FIG. 4*b*.

More particularly the Fermi level EFM of the metal M is lowered with respect to the Fermi level EFS in the bulk of the semiconductor S by an amount corresponding to the externally applied voltage V1.

Moreover, in the surface region of the semiconductor S near the interface D1 the downward bending of the band limits ECS and EVS increases.

The forward conduction is due to electrons tunneling from the conduction band of the semiconductor S into the conduction band of the insulator D through the potential barrier generated at the semiconductor-insulator interface D1. Then the electrons in the conduction band of the insulator D move into metal M under the influence of the electrical field generated in the insulator D due to the external voltage bias. Said tunneling of electrons through the potential barrier at the interface D1 occurs if free energy levels are present beyond the barrier at the same energy level of the electrons in the upper band of the semiconductor S, provided the length of the path to be travelled by said tunneling electrons be sufficiently small to give sufficient probability for said tunneling to occur. The distance to be travelled by the electrons occupying the different energy levels of the upper (conduction) band of the semiconductionr S increases as the levels decrease, said distance being represented in FIG. 4*b* by the horizontal segment comprised between the interface D1 and the upper-band limit ECD of the insulator. Said distance is the width of the barrier to be traversed by the tunneling electrons. It is apparent from FIG. 4*b* that at each one of said levels the barrier width decreases as the externally applied forward voltage V1 increases, due to increasing slope of the upper-band limit line ECD. Therefore, the aforementioned condition for appreciable tunneling to occur is not attained until the externally applied voltage V1 reaches a certain value depending on the dimensions and the physical material properties of the device. This fact accounts for the presence of a conduction threshold in the forward I–V characteristics (FIG. 2).

Upon further increasing the externally applied forward voltage V, the average width of the potential barrier to be traversed by the tunneling electrons decreases due to increasing slope of upper-band limit ECD of the insulator D; furthermore the band limits ECS and EVS of the semiconductor S bend downward more and more in the surface region facing the insulator D due to increasing width and concentration of the electron accumulation layer generated in the semiconductor S near the interface D1, whereby more electrons and more (lower) energy levels are involved in the tunneling process; moreover the electric field strength in the insulating layer D increases, whereby the electrons injected from the semiconductor S into the insulator D through the potential barrier at the interface D1 are rapidly drawn toward the metal M. All these facts account for the rapid increase of the forward current I when the applied forward voltage V exceeds the limit where appreciable tunneling begins to occur (see FIG. 2).

The aforementioned accumulation of electrons near the interface D1 gives rise to a space-charge region at the surface of the semiconductor S. Therefore it is apparent that the tunneling phenomenon from the semiconductor to the metal in the present device is assisted by the presence of said space charge region.

As previously pointed out, the tunneling probability drops rapidly as the thickness of the potential barrier to be traversed by the tunneling electrons increases.

In fact, it is apparent from FIG. 4*b* that, under a given external bias voltage V1, the average thickness of the barrier to be traversed by the tunneling electrons depends on both the thickness of the insulating layer D and the vertical difference between the lower limit ECS of the conduction band of the semiconductor S and the lower limit ECD of the conduction band of the insulator D at the interface D1.

By theoretical considerations analogous to the ones developed in the article "Rectification by Means of Metal-Dielectric-Metal Sandwiches" in "Il nuovo Cimento" Serie V, vol. 31, pages 1246 to 1257, Mar. 16, 1964 by F. Forlani and N. Minnaja, it may be demonstrated that the transparency of the barrier to the tunneling electrons is roughly a decreasing function of the quantity $s_D \cdot \sqrt{\phi_S - X_D}$, where $s_D$ is the average thickness of the insulating layer D, $\phi_S$ is the work function for the semiconductor S and $X_D$ is the electron affinity of the insulator D, the quantity $\phi_S - X_D$ corresponding to the aforementioned difference between the conduction-band limit levels at the interface D1.

Theoretical considerations and experimental results concurrently indicate that for appreciable tunneling to occur the value of the above quantity $s_D \cdot \sqrt{\phi_S - X_D}$ should be less than 300, when $s_D$ is measured in A. and $\phi_S$ and $X_D$ are measured in volts.

In the specific embodiment of the device previously described in connection with exemplification of the manufacturing method, the values $s_D = 180$ A. and $\phi_S - X_D = 0.8$ V. are encountered, whereby the above condition is largely satisfied.

As previously pointed out, the injected electrons after tunneling into the insulating layer D are drawn toward metal layer M under the influence of the electrical field built in the insulating layer itself. However, said electrons are subject to trapping in the trapping centers of the insulating layer. The trapped electrons give rise to a space charge in the insulating layer, whereby line ECD representing the lower limit of the conduction band (FIG. 4*b*) is caused to be curved with the convexity facing the metal layer M, so as to increase the average horizontal distance between interface D1 and upper-band limit ECD. Therefore the average thickness of the potential barrier to be traversed by the tunneling electrons at the different energy levels is increased. From the foregoing it is apparent that the electrons trapped in the insulating layer D act so as to diminish the tunneling probability for the electrons occupying the lower energy states of the conduction band of the semiconductor, thus negatively affecting the forward conduction. Moreover each electron trapped in the insulating layer negatively affects the forward current in that its direct contribution to the conduction mechanism as a mobile charge carrier is eliminated. For these reasons, the concentration of the trapping centers in the insulating layer D must be so low as to allow sufficient drift mobility for the charge carriers therein. Otherwise stated, the mean free path of the electrons before trapping in the insulating layer D must exceed the thickness $s_D$ of the insulating layer itself.

Moreover, fixed positive charges are generated in the insulating layer D due to production of ionized centers under the effect of the applied field. Therefore a positive space-charge distribution is superimposed to the negative space charge generated by the trapped electrons. This positive space-charge distribution acts to curve the upper-band limit ECD in the sense opposite to the bending produced by the trapped electrons. It is thus apparent that said positive space charge built in the insulating layer D acts to assist the tunneling process by decreasing the average barrier width.

The negative resistance observed in the last (high voltage) region of the forward characteristics is deemed to be due to avalanche processes involving ionization of impurities in the insulating layer. The avalanche causes dielectric breakdown which is likely to irreversibly change the external electric characteristics of the device, because pinholes are formed in the structure and their effect on conduction becomes predominant.

Figure 4C:
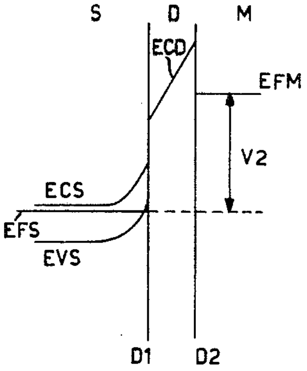

Upon negatively biasing the metal layer M with respect to the semiconductive layer S by externally applying a negative voltage V2 between the positive terminal and the negative terminal of the device, the energy level diagram is modified as sketched in FIG. 4*c*.

More particularly, as the absolute magnitude of the reverse applied voltage V2 increases, the Fermi level EFM of the conductive layer M is raised with respect to the Fermi level EFS in the bulk of the semiconductor S by an amount corresponding to said applied voltage V2. Moreover in the surface region of the semiconductor S near the semiconductor-insulator interface D1 the lines EVS and ECS representing the upper limit of the valence band and the lower limit to the conduction band, respectively, bend upward because an electron depletion layer is formed in said surface region of the semiconductor.

Therefore, a substantial portion of the cumulative potential drop produced in the device upon applying the external bias V2 occurs in said depletion layer, whereby the upward bending of lines ECS and EVS causes the slope of the upper-band limit line ECD in the insulator D to be less than the slope which would be found if the entire potential drop would have occurred in the insulating layer.

It is thus apparent that said surface depletion layer reduces the probability of an electron tunneling from the metal M to the insulator D because it increases the width of the potential to be traversed by said tunneling electron. Therefore the space charge region generated at the surface of the semi-conductor S negatively affects the reverse conduction, whereas its effect on the forward conduction was an aiding one.

This accounts for the low reverse current measured in the first region of the reverse I–V characteristics.

Upon further increasing the absolute magnitude of the reverse applied voltage V2, the surface depletion layer turns into an inversion layer, whereby in the device according to the previously described embodiment the conductivity of said surface region of the semiconductor is altered from N type to P type.

Tunneling of electrons from the metal M to the semiconductor S occurs only upon applying high reverse voltages. The resulting reverse current increases rapidly, and involves breakdown phenomena in the semiconductor S, thus giving rise to the second region of the reverse I–V characteristics, as shown in FIG. 2.

From the foregoing hypothesis on the internal behavior of the device it is apparent that in the conduction mechanism the role of the minority charge carriers of the semiconductor S is unessential. This is confirmed by the experimental measurement of the recovery time of the device. In fact the recovery time, that is the time occurring for switching the current through the device from a predetermined forward value to a predetermined reverse value, is extremely low, because no delaying effect involving recombination of accumulated minority carriers occurs.

In the embodiment previously described. silicon is used as the semiconductor material S. This choice is based on the opportunity of using technologies well established in the semiconductor manufacturing art for growing a silicon dioxide layer onto a silicon wafer.

In fact a further advantage of the device according to the invention is found in that it does not require in principle any new fabrication technique.

However any other semiconductive material, for instance germanium, III·V compounds or II·VI compounds, may be used for the layer S.

The conductivity type, whether N or P, is unessential, as it in principle only affects the sign of the current and the voltage applied through the device.

As to the crystal structure, no special requirement exists. Single-crystal silicon cut along the (111) plane was used in the described embodiment to facilitate uniform growing of the oxide layer. However it is not necessary to use single crystals.

The volume resistivity of the semiconductor material should be conveniently low to avoid degeneracy, which would strongly attenuate the rectifying properties of the device, in that a degenerate semiconductor layer S would act like a metal layer in the known metal-oxide-metal devices.

In the embodiment previously described, thermally-grown silicon dioxide is used as the insulating layer D for the technological reasons stated above.

However any other insulator having different chemical structure may be used, provided the forbidden energy gap between the lower limit ECD of the conduction band and the upper limit of the valence band is sufficiently wide.

For example, the insulator may be vapor-deposited silicon monoxide, aluminum oxide, tantalum oxide, niobium oxide or an organic polymer film.

Aluminum has been used for the conductive layer because, inter alia, gold wire terminals can be easily bonded thereto by thermocompression. However any other metal or metal alloy may be used instead of aluminum for the conductive layer M, such as, for instance, copper, silver, gold-chromium alloy, nickel-chromium alloy or any other metal which can be easily vapor deposited in vacuum. The conductor layer M should adhere to the insulating layer D to produce a uniform junction therewith.

In the previous discussion, the insulator D has been depicted as a layer uniform as to thickness and physical structure.

However, structure uniformity should not be deemed to mean that the layer must be a single crystal. In fact, the aforementioned experimental results have been obtained by using amorphous silicon dioxide layers. The insulating layer should be substantially free from pinholes or other imperfections because current conduction due to said imperfections must not predominate over current due to tunnel effects.

No strict requirement is found as to the insulator thickness uniformity. An insulator layer having a difference between maximum and minimum thickness not exceeding 50% of the average thickness is found to be satisfactory, the only substantial requirement being that any direct contact between the semiconductor S and the conductor M should be avoided.

Therefore it is apparent that the value of the thickness $s_D$ of the insulating layer referred to in the present specification and claims should be interpreted as an average value.

Likewise small junction imperfections at the interfaces D1 and D2 do not appreciably affect the external behavior of the device.

By connecting in parallel two devices made according to invention poled in opposition, a symmetrical varistor working on the direct characteristics of the two devices may be obtained.

By examining the I–V characteristics of the tested specimens, it appears that the reverse current obtained upon applying a reverse voltage bias less than the reverse breakdown voltage is comparable to the reverse current of the best P-N junction rectifiers at present available, and that in general the device according to the invention is comparable to the P-N junction devices as to the rectifying properties. Stability of the external electrical properties upon varying the temperature is higher than in the best silicon P-N junction diodes, as the tunneling process is insensitive to temperature changes.

It is to be noted that in the device according to the invention the exposed surface of the intermediate insulating layer has a great area, whereby influence of surface stray current paths is reduced. Therefore the instability of the electrical characteristics due to changes in the device surface conditions upon varying the environmental conditions is largely tolerable even in not hermetically sealed specimens. As the hermetic sealing accounts for a substantial part of the cost of an electron device, another advantage of the device according to the invention will clearly appear.

As to the fabrication process, it is to be noted that the fabrication time is substantially reduced in comparison with the fabrication time of the P-N diffused junction diodes having similar rectifying properties, because the long impurity-diffusion step is dispensed for. Moreover the several complicated "masking" steps required to control the local growing of oxide or metal layers are substantially reduced in number and complexity, the overall process being simplified due to the reduced requirements as to the geometrical accuracy.

Moreover the device according to the invention may be easily embodied into integrated circuits, for instance rectifier matrices. A particular form of integrated circuit may be obtained by depositing distinct areas of insulating material on a common seimconductor substrate and then depositing thereon suitably interconnected metal layers. Therefore the problem of obtaining integrated circuits comprising deposited rectifying elements, so far practically unsolved, is given a good solution by the device according to the invention.

Another interesting property of the device according to the invention is the strong capacity variation under variable applied voltage.

Figure 3:
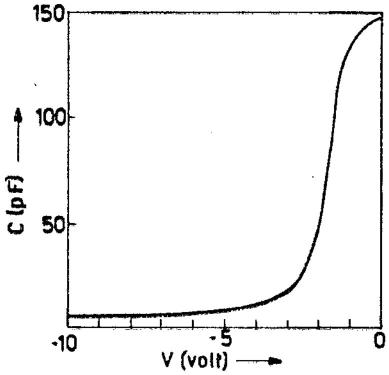
FIG. 3 shows the capacity-voltage characteristics of a device made according to the invention.

In FIG. 3 the capacity C is plotted versus the applied voltage V.

Under positive applied voltages, the capacity has a substantially constant value approximately equal to the capacity of a condenser having a dielectric layer like the insulating layer D interposed between two planar electrodes.

On the contrary, under negative applied voltages the device exhibits a strongly variable capacity. The maximum rate of change occurs in the range 0.5 v.–2 v. for some tested specimens, the maximum-to-minimum capacity ratio being in the range 10 to 20 for said specimens.

It is to be noted that in the known variable-capacity diodes comparable values of the maximum-to-minimum capacity ratio can be obtained. However they do not exhibit a comparably sharp capacity variation. Therefore the device according to the invention may be advantageously substituted for the known devices whenever variable capacity is required.

The fact that the highest rectification ratio has been observed at liquid nitrogen temperature suggests an application of the present device to cryogenic memories and switching circuits.

From the foregoing description it will be understood that many changes may be made in the above device, and different embodiments of the invention could be made without departing from the limits thereof.

It is, therefore, intended that all matter contained in the above description, or shown in the accompanying drawings shall be interpreted as illustrative, and not in a limiting sense.

What is claimed is:

1. An integrated solid-state circuit assembly comprising: a semiconductor layer, an insulator layer deposited on separate areas of said semiconductor layer, and a conductor layer contacting said insulator layer, said insulator layer having a substantially uniform thickness between 100° and 300° so as to pass current due to charge carriers filtering by tunnel effect and a separate low resistance contact to said semiconductor layer and each of said separate areas of said conductor layer contacting said insulator layer.

2. An integrated solid-state circuit assembly comprising: a silicon layer, a silicon dioxide layer grown on separate areas of said silicon layer and having a thickness in excess of 100 A. but not exceeding 300 A., and an aluminum layer deposited on each of said silicon dioxide layer areas, and a separate low resistance contact to said semiconductor layer and each of said separate aluminum layer areas contacting said silicon dioxide areas.

3. A solid-state electron device comprising: a conductor layer, a non-degenerate semiconductor layer, a substantially uniform insulator layer having a thickness, said insulator layer having a thickness in A. units not exceeding the lesser of the thickness of the dimension of the mean free path of the electron before trapping therein or the dimension of thickness calculated from the formula 300 divided by $\sqrt{\phi_S - X_D}$, wherein $\phi_S$ is the work function of the nondegenerate semiconductor layer and $X_D$ is the electron affinity of said insulator and $\phi_S - X_D$ is the difference between conduction-band limit levels at the interface between said semiconductor layer and said insulator layer, and separate low resistance contacts secured to said conductive layer and said semiconductor layer.

4. A solid-state electron device comprising: a conductor layer, an extrinsic semiconductor layer, a substantially uniform insulator layer having a thickness, said insulator layer having a thickness in A. units not exceeding the lesser of the thickness of the dimension of the mean free path of the electron before trapping therein or the dimension of thickness calculated from the formula 300 divided by $\sqrt{\phi_S - X_D}$, wherein $\phi_S$ is the work function of the extrinsic semiconductor layer and $X_D$ is the electron affinity of said insulator and $\phi_S - X_D$ is the difference between conduction-band limit levels at the interface between said semiconductor layer and said insulator layer, and separate low resistance contacts secured to said conductive layer and said semiconductor layer.

References Cited

UNITED STATES PATENTS

| | | | |
|---|---|---|---|
| 3,259,759 | 7/1966 | Giaever | 307—88.5 |
| 3,204,159 | 8/1965 | Bramley | 317—235 |
| 3,056,073 | 9/1962 | Rose | 317—234 |

JOHN W. HUCKERT, Primary Examiner

M. EDLOW, Assistant Examiner

U.S. Cl. X.R.

317—235